US011152195B2

(12) United States Patent
Sato et al.

(10) Patent No.: US 11,152,195 B2
(45) Date of Patent: Oct. 19, 2021

(54) MGO-BASED CERAMIC FILM, MEMBER FOR SEMICONDUCTOR MANUFACTURING APPARATUS, AND METHOD FOR FORMING MGO-BASED CERAMIC FILM

(71) Applicant: NGK INSULATORS, LTD., Nagoya (JP)

(72) Inventors: Yosuke Sato, Hashima-Gun (JP); Katsuhiro Inoue, Tsushima (JP); Yuji Katsuda, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 707 days.

(21) Appl. No.: 15/386,235

(22) Filed: Dec. 21, 2016

(65) Prior Publication Data

US 2017/0117120 A1   Apr. 27, 2017

Related U.S. Application Data

(63) Continuation of application No. PCT/JP2015/067031, filed on Jun. 12, 2015.

(30) Foreign Application Priority Data

Jun. 30, 2014   (JP) .............................. JP2014-133870

(51) Int. Cl.
  *C23C 4/11* (2016.01)
  *H01J 37/32* (2006.01)
  (Continued)

(52) U.S. Cl.
  CPC .......... *H01J 37/32495* (2013.01); *C23C 4/11* (2016.01); *C23C 4/129* (2016.01); *C23C 4/134* (2016.01)

(58) Field of Classification Search
  CPC ..... H01J 37/32495; C23C 4/129; C23C 4/134
  See application file for complete search history.

(56) References Cited

U.S. PATENT DOCUMENTS 5,629,251 A * 5/1997 Miyata ...................... C23C 4/10
  148/27
6,376,405 B1 * 4/2002 Stamires ................ B01J 21/005
  501/108

(Continued)

FOREIGN PATENT DOCUMENTS

JP   H04-055360 A   2/1992
JP   H07-126061 A   5/1995

(Continued)

OTHER PUBLICATIONS

JP-2012232871-A—Bib Data and Translation; Fujii, Namitsugu; Nov. 2012 (Year: 2012).*

(Continued)

*Primary Examiner* — Daniel J. Schleis
*Assistant Examiner* — Elizabeth D Ivey
(74) *Attorney, Agent, or Firm* — Burr & Brown, PLLC (57) ABSTRACT

A MgO-based ceramic film according to the present invention contains crystalline phases of MgO and $MgAl_2O_4$, and Al is dissolved in the MgO to form a solid-solution. The ceramic film exhibits a diffraction peak representing the (200) plane of MgO at an angle $2\theta$ of more than 42.92° in $CuK\alpha$ XRD measurement. A shoulder preferably appears on the higher angle side of the peak representing the (200) plane of MgO. The mass ratio $MgO/Al_2O_3$ of MgO to $Al_2O_3$ converted from Mg and Al in terms of oxides is preferably higher than 2.33.

7 Claims, 5 Drawing Sheets

(51) Int. Cl.
*C23C 4/134* (2016.01)
*C23C 4/129* (2016.01)

(56) References Cited

U.S. PATENT DOCUMENTS

| | | | |
|---|---|---|---|
| 2004/0057832 A1* | 3/2004 | Fleck | C23C 4/02 |
| | | | 416/241 B |
| 2005/0207956 A1* | 9/2005 | Vierheilig | B01D 53/8637 |
| | | | 423/213.2 |
| 2008/0213496 A1* | 9/2008 | Sun | C23C 4/18 |
| | | | 427/453 |
| 2012/0231243 A1 | 9/2012 | Watanabe et al. | |
| 2012/0231945 A1* | 9/2012 | Watanabe | C04B 35/58 |
| | | | 501/98.5 |
| 2013/0235507 A1 | 9/2013 | Aikawa et al. | |
| 2014/0050842 A1 | 2/2014 | Fujii et al. | |
| 2015/0183651 A1* | 7/2015 | Peoples | C04B 35/443 |
| | | | 423/600 |

FOREIGN PATENT DOCUMENTS

| | | | |
|---|---|---|---|
| JP | 4368021 B2 | 11/2009 | |
| JP | 2010-018853 A | 1/2010 | |
| JP | 2012-232871 A1 | 11/2012 | |
| JP | 2012232871 A * | 11/2012 | C01F 7/162 |
| JP | 5188898 B2 | 4/2013 | |
| KR | 10-2013-0121663 | 11/2013 | |
| TW | 201246443 A1 | 11/2012 | |
| WO | 2012/056875 A1 | 5/2012 | |
| WO | 2012/056876 A1 | 5/2012 | |

OTHER PUBLICATIONS

Translation and Bib Data—JP-2012232871-A; Fujii, Namitsugu; JP-2012232871-A (Year: 2012).*
International Search Report and Written Opinion (Application No. PCT/JP2015/067031) dated Aug. 25, 2015 (Corrected Oct. 20, 2015).
Taiwanese Office Action (Application No. 104119353) dated Aug. 14, 2018.
Korean Office Action, Korean Application No. 10-2016-7035783, dated Apr. 10, 2018 (6 pages).
English translation of International Preliminary Report on Patentability (Application No. PCT/JP2015/067031) dated Jan. 12, 2017.
Japanese Office Action (with English translation), Japanese Application No. 2016-531233, dated May 7, 2019 (6 pages).
Korean Office Action (with English translation), Korean Application No. 10-2016-7035783, dated Jun. 14, 2019 (7 pages).

* cited by examiner

MGO-BASED CERAMIC FILM, MEMBER FOR SEMICONDUCTOR MANUFACTURING APPARATUS, AND METHOD FOR FORMING MGO-BASED CERAMIC FILM

BACKGROUND OF THE INVENTION

1. Field of the Invention

The present invention, relates to a MgO-based ceramic film, a member for semiconductor manufacturing apparatus, and a method for forcing a MgO-based ceramic film.

2. Description or the Related Art

In semiconductor manufacturing apparatuses used in dry processes or for plasma coating in the manufacture of semiconductors, highly reactive or corrosive halogen-based plasma, such as that of F or Cl, is used for etching or cleaning. Accordingly, the members or components used in such a semiconductor manufacturing apparatus are required to be resistant, to corrosion. The material of these members is likely to corrode gradually through long-term use and thus generate dust or the like. This is a cause of contamination of semiconductors. Accordingly, a highly corrosion-resistant material is desired. Alumina, aluminum nitride, yttria, and the like are known as highly corrosion-resistant materials and are used in semiconductor manufacturing apparatuses. Other corrosion-resistant materials include, for example, those disclosed in PTLs 1 and 2.

PTL 1 discloses a thermal spray coating film of spinel-type ceramic containing mainly MgO and $Al_2O_3$ with a mass ratio ($MgO/Al_2O_3$) of MgO to $Al_2O_3$ in the range of 0.25 to 1.5. This ceramic thermal spray coating film has a volume resistivity of $1\times10^8$ Ωcm to $1\times10$ Ωcm, and the lattice constant of the spinel crystals is a=8.084 Å or more. PTL 1 describes that the $MgO/Al_2O_3$ mass ratio is 1.50 or less, and that this is because while a high MgO content is desirable in view of corrosion resistance, such a coating film is water absorbent, accordingly difficult to handle, and becomes less resistant to corrosion when has absorbed water.

PTL 2 discloses a corrosion-resistant spinel-type ceramic material containing mainly MgO and $Al_2O_3$ with a weight ratio of MgO to $Al_2O_3$ in the range of 1 to 2.33 and having an average crystal grain size of less than 3 μm. PTL 2 describes that if the weight ratio of MgO exceeds 2.33, the corrosion resistance decreases due to the excessive MgO content.

CITATION LIST

Patent Literature
JP 5188898 B
JP 4368021 B

SUMMARY OF INVENTION

A ceramic film that is highly resistant to corrosion despite containing a high proportion of MgO is not known. For example, PTL 1 describes that ceramic thermal spray coating films containing a high proportion of MgO is water absorbent and is therefore likely to deteriorate in corrosion resistance. In reality, a ceramic thermal spray coating film with a $MgO/Al_2O_3$ mass ratio of more than 1.5 exhibits a high etching rate, and thus the corrosion resistance of this ceramic film is low. PTL 2 also describes that an excessively high MgO content results in reduced corrosion resistance. In reality, a sintered body with a $MgO/Al_2O_3$ mass ratio of, for example, 2.4 or 2.57 exhibits a high etching rate and is less resistant to corrosion.

The present invention is intended to solve the above issue, and a major object of the invention is to provide a MgO-based ceramic film having a high corrosion resistance.

The present inventors examined the corrosion resistance of MgO-based ceramic films, each formed by thermal spraying of a thermal spray raw material, prepared by granulating a mixture of MgO and $Al_2O_3$ in various proportions and then heat-treating the granules at a predetermined temperature, and found that some of the MgO-based ceramic films have superior corrosion resistance. The present inventors thus realized the present invention.

The MgO-based ceramic film according to the present invention contains crystalline phases of MgO and $MgAl_2O_4$, and Al, but not AlN, is dissolved in the MgO to form a solid-solution. The ceramic film exhibits a diffraction peak representing the (200) plane of MgO at an angle 2θ of more than 42.92° in CuKα XRD measurement.

The method for forming a MgO-based ceramic film of the present invention includes preparing a thermal spray raw material by granulating MgO and $Al_2O_3$ and heat-treating the granules at 1200° C. or more, and thermally spraying the thermal spray raw material onto a substrate to form the MgO-based ceramic film.

DETAILED DESCRIPTION OF THE INVENTION

The MgO-based ceramic film of the present invention contains crystalline phases of MgO and $MgAl_2O_4$, and Al is dissolved in the MgO to form a solid-solution. The ceramic film exhibits a diffraction peak representing the (200) plane of MgO at an angle 2θ of more than 42.92° in CuKα XRD measurement. The term "MgO-based ceramic film" mentioned herein refers to a ceramic film in which the compound having the highest content on a percent-by-mass basis is MgO. For example, a ceramic film containing more than 50% by mass of MgO is the MgO-based ceramic film. The MgO-based ceramic film of the present invention is superior in corrosion resistance. One of the reasons of this is probably that the rate of water absorption by the MgO-based ceramic film of the present invention is lower them that by simple MgO ceramics.

In CuKα XRD measurement of the ceramic film, the diffraction peak representing the (200) plane of MgO is preferably shifted to the higher angle side, and more preferably appears at an angle 2θ of 42.96° or higher. When this peak is shifted to the higher angle side, a larger amount of Al is dissolved to improve the water resistance of the MgO.

In the CuKα XRD measurement of the MgO-based ceramic film of the present invention, a further diffraction peak or shoulder may appear on the higher angle side of the peak representing the (200) plane of MgO. The further diffraction peak or shoulder is assumed to be derived from MgO having the same crystal structure, but having a lattice constant varied by further dissolved Al to form a solid-solution. For example, such MgO is produced through: a thermodynamically non-equilibrium condition brought by, for example, rapidly cooling the material try thermal spraying. If peak separation of the further diffraction peak or shoulder is possible, the corrosion resistance tends to be low. It is therefore desirable that the further peak be not recognized as a diffraction peak or be recognized as a shoulder that cannot, be separated. From the viewpoint of increasing water resistance, however, it is desirable that the farther diffraction peak or shoulder be clearly separate. This is because weight decrease resulting from water absorption tends to be small. Probably, the further diffraction peak or shoulder suggests that the property of MgO being less resistant, to water is improved by Al dissolved in the MgO to form a solid-solution.

In the MgO-based ceramic film of the present invention, preferably, the mass ratio $MgO/Al_2O_3$ of MgO to $Al_2O_3$ converted from Mg and Al in terms of: oxides is higher than 2.33. If the mass ratio $MgO/Al_2O_3$ is 2.33 or lower, the corrosion resistance tends to be low. It is therefore preferably higher than 2.33.

Preferably, the MgO-based ceramic film of the present invention is a thermal spray coating film. The thermal spraying may be performed by any method, such as plasma radiation, gas thermal spraying, or gas explosion spraying, without being limited as long as the thermal spray raw material can be melted.

The MgO-based ceramic film of the present invention exhibits a diffraction peak representing the (200) plane of MgO (hereinafter referred to as diffraction peak (A)) and may have a further diffraction peak or shoulder on the higher angle side of the peak of the (200) plane of (hereinafter referred to as diffraction peak (B)). The ratio $I_B/I_A$ of the peak heights is preferably 0.33 or less, more preferably less than 0.22. Since it is thought that the crystalline phase of diffraction peak (B) is formed through a thermodynamically non-equilibrium condition the crystallinity thereof is expected to be low, and the corrosion resistance is also expected to be low. However, since Al is dissolved in the MgO crystals to form a solid-solution, diffraction peak (B) may appear, from the viewpoint of maintaining water resistance, to the extent, that the corrosion resistance is not negatively affected.

The proportion, represented by $I_C/(I_A+I_B)$, of the peak heights of diffraction peaks (A) and (B) and the diffraction peak representing the (220) plane of $MgAl_2O_4$ (hereinafter referred to as diffraction peak (C)) in the MgO-based ceramic film of the present invention is preferably 0.2 or less, and is more preferably 0.1 or less. If this value increases, $MgAl_2O_4$, which is less corrosion-resistant, increases relative to MgO, and accordingly the corrosion resistance of the ceramic film decreases.

Preferably, the MgO-based ceramic film of the present invention has a porosity of 20% or less, more preferably 15% or less, still more preferably 13% or less. The porosity of a film can be calculated from the ratio of the area of the pores in the film to the area of the film, obtained by image processing a cross-sectional photograph of the film. If the true density of the film is known, the porosity of the film, may be determined by the Archimedean method. The porosity can also be determined by any other method. A porosity of more than 20% is undesirable. In such a case, the strength of the thermal spray coating film can decrease, or the material, of the film can release grains therefrom and cause dust generation. Furthermore, a less corrosion-resistant portion of the substrate becomes likely to be attacked by corrosive halogen-based plasma, it is desirable that the porosity be as close to zero as possible. Therefore, there is no lower limit.

The MgO-based ceramic film of the present invention may be used as a coating film for covering the surface of a semiconductor manufacturing apparatus member. Such semiconductor manufacturing apparatus members include an electrostatic chuck, a susceptor, a heater, a plate, a chamber, an inner wall member, a monitoring window, a microwave introducing window, and a microwave coupling antenna. Since such members must be corrosion-resistant to corrosive gas plasma containing halogen atoms, it is advantageous that they be covered with the MgO-based ceramic film of the present invention.

In the method for forming the MgO-based ceramic film, a thermal spray raw material is prepared by granulating MgO and $Al_2O_3$ as the raw materials and heat-treating the granules at 1200° C. or more, and the thermal spray raw material is thermally sprayed onto a predetermined substrate. The thermal spray raw material, which is prepared by heat-treating granules of MgO and $Al_2O_3$, contains crystalline phases of MgO and $MgAl_2O_4$. The thermal spray raw material is in a state where MgO and $MgAl_2O_4$ are favorably in contact with each other and facilitates the formation of the MgO-based ceramic film, in which Al is dissolved in MgO to form a solid-solution while a larger part of MgO remains as is, compared with a simple mixture of MgO and $MgAl_2O_4$. The use of such a thermal spray raw materiel for thermal spraying is not described or suggested in PTL 1 or 2. The thermal spraying may be performed by any method, such as plasma thermal spraying, gas thermal spraying, or gas explosion spraying, without being limited as long as the thermal spray raw material can be melted. Plasma gases include, but are not limited to, argon, helium, nitrogen, hydrogen, and oxygen, and combinations of two or more of these gases. The conditions of the thermal spraying are not particularly limited and are appropriately set according to the thermal spray raw material and the substrate on which the coating film will be formed.

EXAMPLES

Examples of the present invention will now be described. However, it should be appreciated that the following Examples are not intended to limit the invention. Experimental Examples 1 to 9 are specific examples of the thermal spray raw material, and Experimental Examples 1-1 to 9-1 are specific, examples of the thermal spray coating film. Among those, Experimental Examples 1-1 to 7-1 correspond to Examples of the present invention, and Experimental Examples 8-1 and 9-1 correspond to Comparative Examples.

Experimental Examples 1 to 3

(Preparation of Thermal Spray Raw Materials)

The thermal spray raw materials of Experimental Examples 1 to 7 were prepared in the following process. First, raw material MgO (purity: 99.9% by mass or more, particle size (D50): 3 μm or less), raw material $Al_2O_3$ (purity: 99.9% by mass or more, particle size (D50); 1 μm or less) were weighed out proportionally on a percent-by-mass basis shown in Table 1. Then, water and a dispersant (Serander, produced by Yuken) were added in a powder-to-water proportion of 30% by mass to 70% by mass and in a dispersant proportion of: 1% by mass relative to the power. These materials were wet-mixed in a nylon pot containing 20 mm iron-core nylon balls. The resulting slurry of the mixture was formed into granules by being sprayed with a spray dryer. The granules thus produced are referred to as "SD granules". Then, the granules were heat-treated at 1600° C. in an air atmosphere. The resulting heat-treated powder was subjected to sieving through a vibration sieve with 75 μm openings. The powder collected under the sieve was used as the thermal spray raw material.

In Experimental Example 8, commercially available raw material MgO (particle size (D50): 34 μm) and commercially available raw material MgAl$_2$O$_4$ (particle size (D50): about 4 μm), which were pulverized, were mixed so that the mixture had the same MgO/Al$_2$O$_3$ ratio as in Experimental Example 4. The mixture was granulated into SD granules in the same manner as in Experimental Examples 1 to: 7, The resulting granules, without being heat-treated, were used as the thermal, spray raw material. In Experimental Example 9, the commercially available raw material MgO used in Experimental Example 8 was solely used, as the thermal spray raw material.

(Evaluation of Thermal Spray Raw Materials)
1) XRD Measurement

Crystalline phases were identified with an X-ray diffractometer. The measurement was performed under the conditions of CuKα, 40 kV, 40 mA, and 2θ=10° to 70°, using a sealed tube X-ray difftactometer (D8 ADVANCE manufactured by Bruker AXS). The measurement was performed at intervals of 0.02°. For determining the diffraction angle of each peak top, peak positions were corrected by adding NIST Si standard reference material powder (SRM 640 C). The results are shown in Table 1.

2) Particle Size Distribution

The particle size distribution of the resulting powder of each thermal spray raw material was measured. For this measurement, Microtrac MT3300 EX II manufactured by Nikkiso was used, and the particle sizes at 10% (DIG) and 90% (D90) in cumulative particle size distribution were determined. The results are shown in Table 1.

3) SBM Observation

Each of the resulting thermal spray raw materials was observed by SEM.

TABLE 1

| | Raw Material Powder (Preparation Composition) | | | | Thermal Spray Raw Material (after firing) | |
|---|---|---|---|---|---|---|
| | MgO wt % | Al$_2$O$_3$ wt % | MgAl$_2$O$_4$ wt % | Crystalline Phase | D10 μm | D90 μm |
| Experimental Example 1 | 96.0 | 4.0 | 0.0 | MgO, MgAl$_2$O$_4$ | 29 | 58 |
| Experimental Example 2 | 84.7 | 15.3 | 0.0 | MgO, MgAl$_2$O$_4$ | 30 | 58 |
| Experimental Example 3 | 81.0 | 19.0 | 0.0 | MgO, MgAl$_2$O$_4$ | 29 | 60 |
| Experimental Example 4 | 76.0 | 24.0 | 0.0 | MgO, MgAl$_2$O$_4$ | 31 | 59 |
| Experimental Example 5 | 72.5 | 27.5 | 0.0 | MgO, MgAl$_2$O$_4$ | 33 | 60 |
| Experimental Example 6 | 67.6 | 32.4 | 0.0 | MgO, MgAl$_2$O$_4$ | 31 | 61 |
| Experimental Example 7 | 59.5 | 40.5 | 0.0 | MgO, MgAl$_2$O$_4$ | 32 | 63 |
| Experimental Example 8 | 66.5 | 0.0 | 33.5 | MgO, MgAl$_2$O$_4$ | | |
| Experimental Example 9 | 100 | 0 | 0 | MgO | 22 | 55 |

(Evaluation Results of Thermal Spray Raw Materials)

Figure 1:
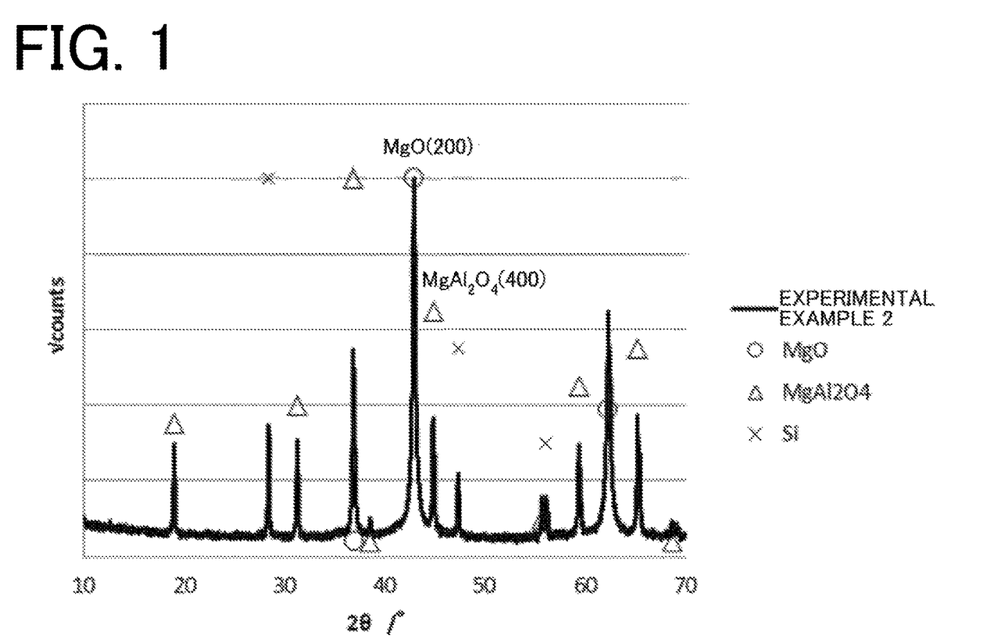
FIG. 1 is a XRD measurement result of the thermal spray raw material in Experimental Example 2.

The XRD measurement result of the thermal spray raw material in Experimental Example 2 is shown in FIG. 1. FIG. 1 shows that the crystalline phases are made of MgO and MgAl$_2$O$_4$. The same applies to Experimental Examples 1 and 3 to 8 (not shown). According to the SEM observation, the particles of the thermal spray raw materials of Experimental Examples 1 to 7 had a larger primary particle size than the particles of the original MgO and Al$_2$O$_3$ as the raw materials while the necks thereof were connected to each other. This suggests that the heat treatment caused the MgO and the Al$_2$O$_3$ to react with each other and produce MgO and MgAl$_2$O$_4$, and that the particles were partially sintered, resulting in favorable contact between MgO and MgAl$_2$O$_4$. In Experimental Example 8, on the other hand, growth of MgO and MgAl$_2$O$_4$ particles was not observed, and the necks of the particles were not connected to each other.

Experimental Examples 1-1 to 9-11

(Formation of Thermal Spray Coating Films)

An aluminum substrate having Ra>1 μm was prepared as a substrate to be subjected to thermal spraying. The thermal spray raw materials prepared in Experimental Examples 1 to 9 were each plasma-sprayed onto the substrate in an air atmosphere under the conditions shown in Table 2.

The thermal spray coating film of Experimental Example N-1 was formed using the thermal spray raw material of Experimental Example N (N represents an integer of 1 to 9) in such a manner that, for example, the thermal spray raw material of Experimental Example 1 and the thermal spray raw material of Experimental Example 2 were used in Experimental Examples 1-1 and Experimental Example 2-1, respectively. In Experimental Examples 1-1 to 7-1, the resulting thermal spray coating film had a thickness of 30 μm to 210 μm. In the case of using the thermal spray raw material of Experimental Example 8, the thickness of the thermal spray coating film was smaller than that of Experimental Examples 1 to 7. Accordingly, the number of times of thermal spraying was increased so that the thermal spray coating film could have a thickness of 30 μm. In the case of using the thermal spray raw material of Experimental Example 9, a thermal spray coating film was not formed despite repeating spraying the same number of times using substantially the same amount of powder as in Experimental Examples 1-1 to 7-1.

(Evaluation of Thermal Spray Coating Films)
1) XRD Measurement

Crystalline phases were identified with an X-ray diffractometer. The resulting thermal spray coating film was removed from the substrate and then crashed into powder in a mortar. The measurement was performed under the conditions of CuKα, 40 kV, 40 mA, and 2θ=10° to 70°, using a sealed tube X-ray diffractometer (D8 ADVANCE manufactured by Bruker AXS). The measurement was performed at intervals of 0.02°. For determining the diffraction angle of each peak top, peak positions were corrected by adding NIST Si standard reference material powder (SRM 640 C). After confirming that diffraction peaks were detected around the potions corresponding to the peaks of the (111), (200), and (220) planes of MgO in ICDD 78-0430, the position of the peak top representing the (200) plane of MgO was determined for each thermal spray coating film. Also, the peak height was determined by using the peak search function of a commercially available software program JADE 7 manufactured by MDI. In JADE 7, peak search parameters were set as follows. Type of filter: variable, parabolic filter; and Definition of peak position: peak top. The threshold and range were set as follows. Threshold: σ=3.0; peak intensity (%) cutoff=0.1; Range to find BG=1.0; number of points for averaging BG=7; removal of Kα2 peak: ON; and removal of existing peak list: ON. For each thermal spray coating film, the crystalline phases, the peak top position of the (200) plane of MgO, and the heights of diffraction peaks (A) to (C) are shown in Table 2. Diffraction peaks (A) to (C) will be described later.

2) Compositional Analysis

The resulting thermal spray coating film was removed from the substrate and then crushed into a powder in a mortar for chemical analysis. After dissolving the sample, Mg and Al were determined by chelate titration. The results are shown in Table 2.

3) Corrosion Resistance Test

The surface of the resulting thermal spray coating film was mirror-polished and examined, for corrosion resistance with a mask partially covering the coating film in an IC plasma corrosion resistance test apparatus under the following conditions. The difference in height, between the portion of the surface covered with the mask and the exposed portion of the surface was measured with a step meter. The etching rate of each material was calculated by dividing the difference in height between the masked surface and the exposed surface by testing time. The results are shown in Table 2.

ICP: 800 W; bias: 450 W; gas introduced: $NF_3/O_2/Ar=75/35/140$ sccm, 0.05 Torr; exposure time: 5 h; sample temperature: room temperature 4) Water Absorption Test The thermal spray coating films of Experimental Examples 1-1 to 7-1 were removed from the substrate. After the thermal spray coating films were then, stored in an environment of 30° C. and 95% humidity for 4 days, the weight decrease of each film was examined by TG-DTA by heating the film to 500° C. in air. The results are shown in Table 2. For the case of using MgO, where a thermal spray coating film was not able to be formed, commercially available MgO powder was pressed into a compact and the compact was heat-treated at 1600° C. and adjusted to a thickness of about 200 μm. The resulting compact was examined as the thermal spray coating film for determining the weight decrease. The weight decrease measured was divided by the area of one side of the thermal spray coating film (in the case of MgO, area of the surface of the compact). The results are shown, in Table 2.

5) Constituent Elements

The section of each of the thermal spray coating films of Experimental Examples 1-1 to 7-1 was covered with an epoxy resin while air bubbles were removed by evacuation. After the epoxy resin, solidified, the section was mirror-polished, and constituent elements were detected and identified with an EPMA.

6) Porosity

The thermal, spray coating film was covered with a resin (epoxy resin) to fill the pores in the thermal spray coating film, with the resin. The thermal spray coating film was then cut to expose a section: thereof, and the section was polished. Then, an SBM image of the section, was taken with, an SEM (scanning electron microscope). The SEM image was taken at a magnification of 500 times and 712×532 pixels. The resulting image was converted into a 16-bit gray scale image by an image processing software program (Image-Pro Plus 7.0J manufactured by Media Cybernetics) (scaling by multiplication) and subsequently binarized. The porosity of the coating film was thus calculated. The threshold for binarization was set using Otsu's binarization method as a discriminant analysis method.

TABLE 2

| | Condition of Plasma Spraying | | | Thermal Spray Coating Film | | | | | | | | | | | |
|---|---|---|---|---|---|---|---|---|---|---|---|---|---|---|---|
| | | Gas Introduced | | | | | | | | | Compositional Analysis | | MgO/ $Al_2O_3$ | Etching | Weight |
| | Current A | Ar L/min | $H_2$ L/min | Crystal- line Phase*1 | Peak Top MgO(200) | $I_A$*2 | $I_B$*3 | $I_C$*4 | $I_B/I_A$ | $I_C/(I_A+I_B)$ | Mg wt % | Al wt % | Mass Ratio | Rate μm/h | Decrease mg/cm³ | Porosity % |
| Experimental Example 1-1 | 600 | 41 | 14 | MgO(A) MgO(B) $MgAl_2O_4$ | 42.96 | 6259 | Cannot be Separated | 101 | 0 | 0.016 | 54.6 | 4.8 | 9.98 | 0.12 | 1.0 | |
| Experimental Example 2-1 | 600 | 41 | 14 | MgO(A) MgO(B) $MgAl_2O_4$ | 43.00 | 4950 | Cannot be Separated | 155 | 0 | 0.031 | 48.6 | 10.6 | 4.01 | 0.13 | 0.5 | 14.5 |
| Experimental Example 3-1 | 600 | 41 | 14 | MgO(A) MgO(B) $MgAl_2O_4$ | 43.00 | 5483 | Cannot be Separated | 237 | 0 | 0.043 | 46.9 | 11.8 | 3.49 | 0.13 | 0.5 | |
| Experimental Example 4-1 | 600 | 41 | 14 | MgO(A) MgO(B) $MgAl_2O_4$ | 43.00 | 6629 | Cannot be Separated | 428 | 0 | 0.065 | 44.7 | 13.8 | 2.84 | 0.14 | 0.4 | 12.7 |
| Experimental Example 5-1 | 600 | 41 | 14 | MgO(A) MgO(B) $MgAl_2O_4$ | 43.06 | 5874 | Cannot be Separated | 472 | 0 | 0.080 | 42.6 | 15.6 | 2.40 | 0.15 | 0.4 | |
| Experimental | 600 | 41 | 14 | MgO(A) | 43.06 | 4204 | 944 | 527 | 0.22 | 0.102 | 39.2 | 18.5 | 1.86 | 0.19 | 0.4 | 8.1 |

TABLE 2-continued

| | Condition of Plasma Spraying | | | Thermal Spray Coating Film | | | | | | | | | | | |
|---|---|---|---|---|---|---|---|---|---|---|---|---|---|---|---|
| | | Gas Introduced | | | | | | | | | Compositional Analysis | | MgO/Al$_2$O$_3$ Mass Ratio | Etching Rate μm/h | Weight Decrease mg/cm$^3$ | Porosity % |
| | Current A | Ar L/min | H$_2$ L/min | Crystalline Phase*[1] | Peak Top MgO(200) | I$_A$*[2] | I$_B$*[3] | I$_C$*[4] | I$_B$/I$_A$ | I$_C$/(I$_A$+I$_B$) | Mg wt % | Al wt % | | | | |
| Example 6-1 | | | | MgO(B) MgAl$_2$O$_4$ | | | | | | | | | | | | |
| Experimental Example 7-1 | 600 | 41 | 14 | MgO(A) MgO(B) MgAl$_2$O$_4$ | 43.10 | 2430 | 805 | 586 | 0.33 | 0.181 | 35.5 | 22.0 | 1.41 | 0.22 | 0.2 | 7.3 |
| Experimental Example 8-1 | 600 | 41 | 14 | MgO MgAl$_2$O$_4$ | 42.92 | 716 | Cannot be Separated | 1044 | 0 | 1.48 | | | | | | |
| Experimental Example 9-1 | 600 | 41 | 14 | | | | Thermal Spray Coating Film Cannot be Formed | | | | | | | | | |

*[1] MgO(A) is MgO solid-solution in which diffraction peak (A) was detected, MgO(B) is MgO solid-solution in which diffraction peak (B) was detected.
*[2] I$_A$ is the peak height of diffraction peak (A).
*[3] I$_B$ is the peak height of diffraction peak (B).
*[4] I$_C$ is the peak height of diffraction peak (C).

(Evaluation of Thermal Spray Coating Films)

In the XRD measurements of the thermal spray coating films of Experimental Examples 1-1 to 8-1, diffraction peaks, including the peak of the (200) plane of MgO, were detected around positions corresponding to MgO in ICDD 78-0430. Also, magnesium aluminum oxide (MgAl$_2$O$_4$) was detected.

Figure 2:
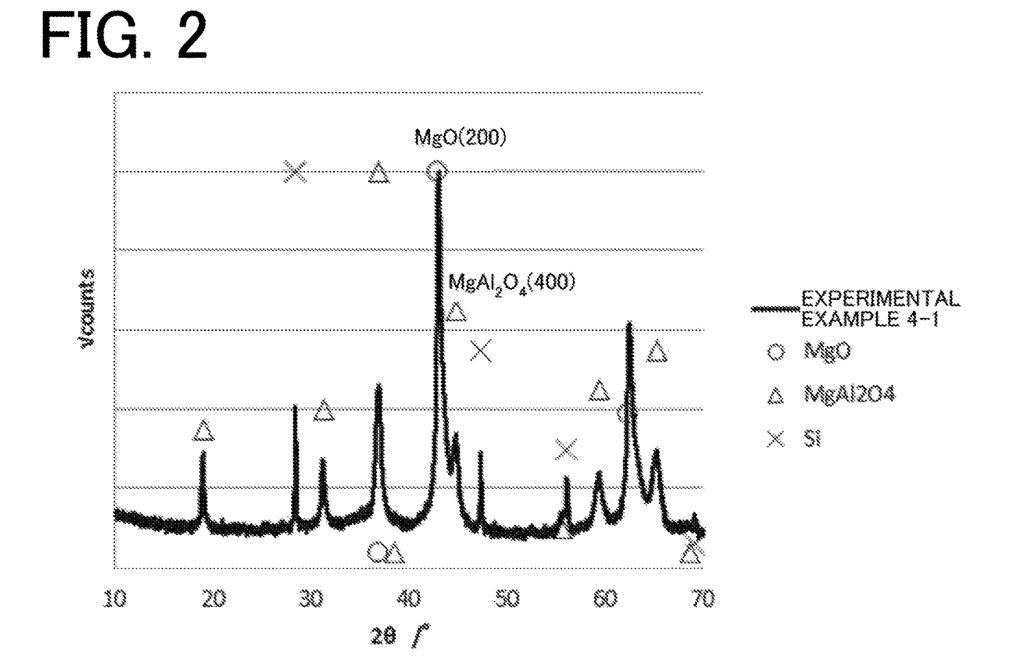
FIG. 2 is a XRD measurement result of the thermal spray raw material in Experimental Example 4-1.
Figure 3:
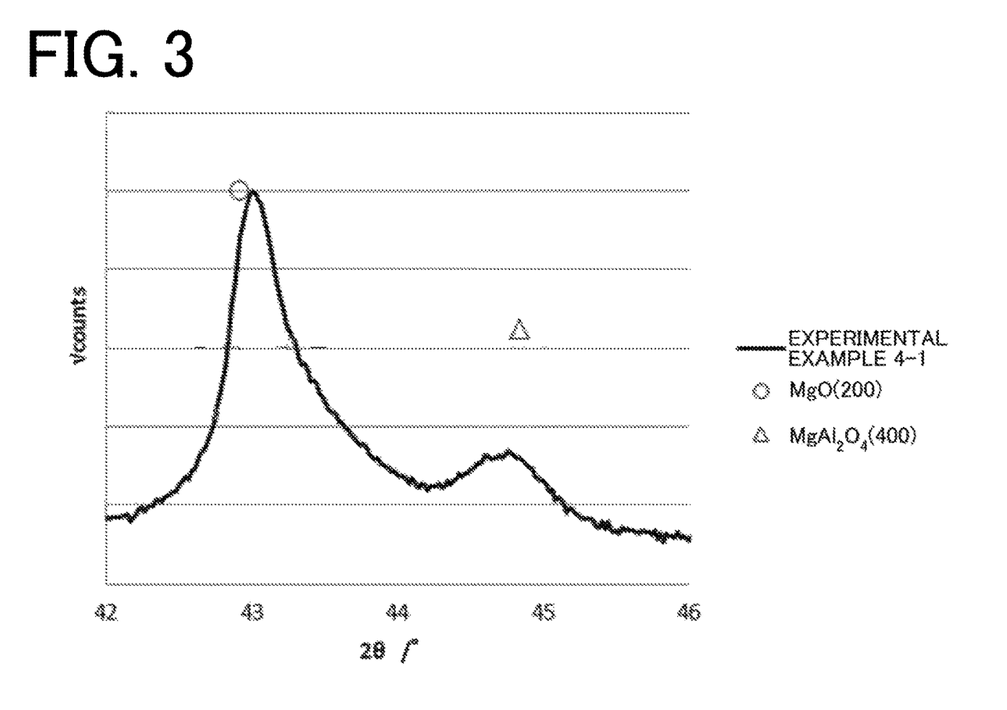
FIG. 3 is an enlargement of FIG. 2.
Figure 4:
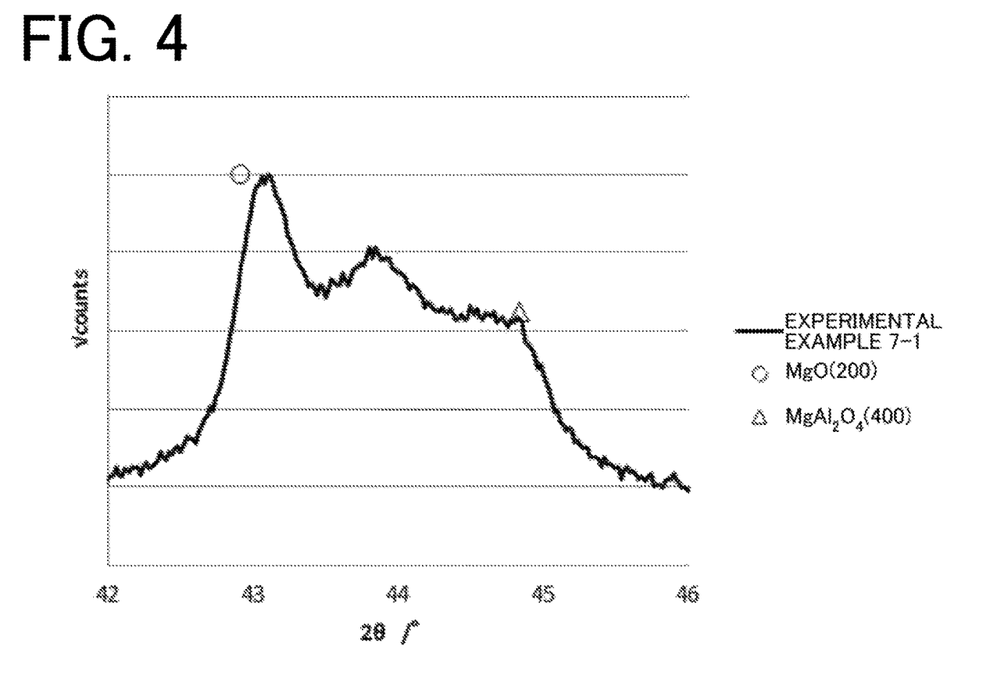
FIG. 4 is an enlargement of the XRD peaks of Experimental Example 7-1.
Figure 5:
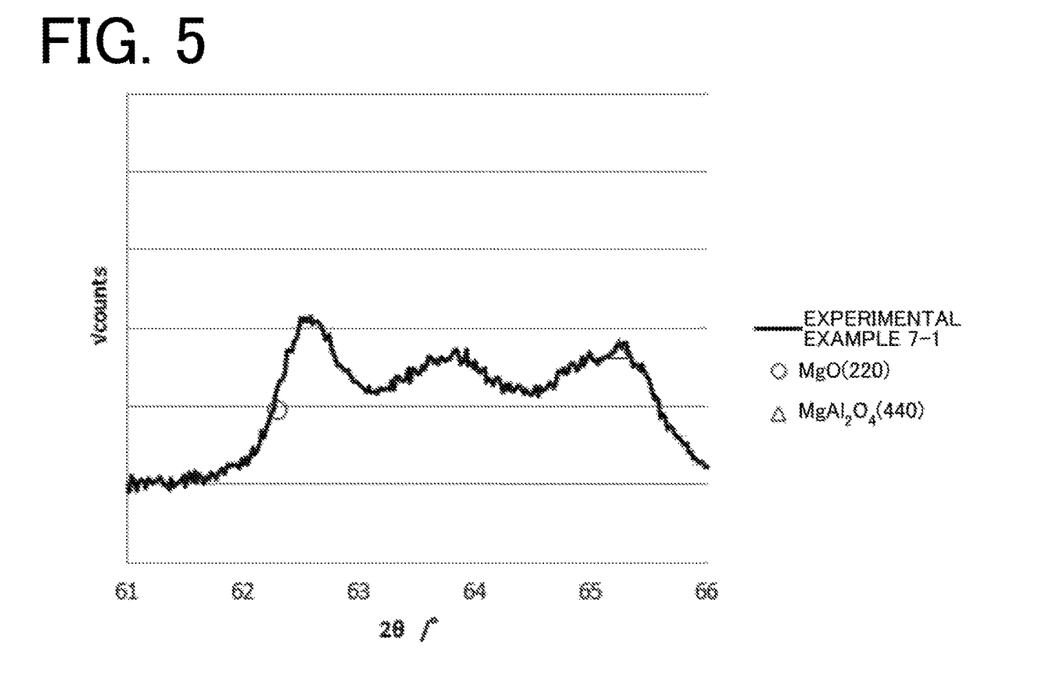
FIG. 5 is an enlargement of the XRD peaks of Experimental Example 7-1.

As representative examples, the XRD analytical chart of Experimental Example 4-1 is shown in FIG. 2, and an enlargement of FIG. 2 is shown in FIG. 3. Also, FIG. 4 shows an enlargement of the XRD peaks of Experimental Example 7-1. FIG. 2 shows that the thermal spray coating film of Experimental Example 4-1 contains MgO and magnesium aluminum oxide (MgAl$_2$O$_4$). Similarly, it was found, that the others Snot shown in the drawings) of the thermal spray coating films of Experimental Examples 1-1 to 8-1 contain MgO and MgAl$_2$O$_4$. FIGS. 3 and 4 show that Experimental Examples 4-1 and 7-1 exhibited the diffraction peak of the (200) plane of MgO (hereinafter referred to as diffraction peak (A)) at a larger angle than MgO (ICDD 78-0430). Similarly, the others (not shown in the drawings) of the samples of Experimental Examples 1-1 to 7-1 exhibited the peak on the larger angle side, as shown in Table 2. FIG. 4 shows a further peak that the raw material did not show (hereinafter referred to as diffraction peak (B)) at a larger angle than the angle corresponding to the (200) plane of MgO and between this angle and the angle corresponding to the (400) plane of MgAl$_2$O$_4$. FIG. 5 shows an enlargement of the peak representing the (220) plane of MgO in Experimental Example 7-1. It was found that another diffraction peak that the raw material did not show appeared on the larger angle side of the diffraction peak representing the (220) plane of MgO, as with the case of the (200) plane of MgO. The peak of the (111) plane of MgO, which appears very close to the (311) plane of MgAl$_2$O$_4$, was not able to be separated. The presence thereof on the larger angle side was therefore not able to be confirmed. Most elements, except Mg, Al, and O, were not detected by EPMA, which will be described later. This suggests that the further peak, that is, diffraction peak (B), represents a substance having a lattice constant different from the substance of diffraction peak (A), but having the same crystal structure as MgO. In Experimental Example 4-1 shown in FIG. 3, a small shoulder appeared on the larger angle side of the diffraction peak of the (200) plane of MgO. This suggests the presence of a very small amount of crystalline phase having the same crystal structure as MgO as in the case of Experimental Example 7-1. However, diffraction peak (B) was not able to be separated by the above-described peak separation, and the peak height thereof is assumed to be very low. Table 2 shows the heights of diffraction, peaks (B) together. Diffraction peak (B) was observed in ail the samples, but some of the peaks were not able to be clearly separated. Table 2 also shows the peak height of the diffraction peak representing the (220) plane of MgAl$_2$O$_4$ (hereinafter referred to as diffraction peak (C)). Diffraction peak (C) appears around $2\theta=31.27°$. As the Al content in the thermal spray raw material is reduced, the peak height decreases. It was found that the lower the Al content, the lower the amount of MgAl$_2$O$_4$ produced. In Experimental Example 8-1, MgO and MgAl$_2$O$_4$ were detected, but the peak of MgO was substantially not shifted to the larger angle side. In Experimental Example 8-1, diffraction peak (C) from MgAl$_2$O$_4$ was larger than diffraction peak (A) from MgO. These results suggest that a thermal spray raw material prepared from fine MgO and Al$_2$O$_3$ particles by heat treatment for a reaction in which MgO and MgAl$_2$O$_4$ are favorably in contact with, each other in such a manner that, for example, the necks thereof are connected to each other can form a MgO-based ceramic thermal spray coating film in which Al is dissolved in MgO to form a solid-solution while a larger part of MgO remains as is, as in Experimental Examples 1-1 to 7-1, compared with a powder prepared by simply mixing MgO and MgAl$_2$O$_4$, as in Experimental Example 8-1.

EPMA measurement results showed that the film includes mainly portions containing a very small amount of Al in Mg and O and portions containing a larger amount of Al than the former portions. The former portions are considered to be MgO, and the latter portions are considered to be MgAl$_2$O$_4$. These results and the results of XRD measurement suggest that Al is dissolved in MgO to form a solid-solution. Some phases containing Al in an amount larger than the amount of Al dissolved in MgO to form a solid-solution and smaller than the amount of Al in MgAl$_2$O$_4$ were observed. These phases are considered to be portions corresponding to diffraction peak (B).

Table 2 shows the results of chemical analysis of the thermal spray coating films and the mass ratio $MgO/Al_2O_3$ of MgO to $Al_2O_3$ converted in terms of oxides from the results of the chemical analysis for Mg and Al. In Experimental Examples 1-1 to 5-1, the mass ratios were higher than 2.33. In Experimental Examples 6-1 to 7-1, the mass ratios were 2.33 or lower.

The etching rates of the thermal spray coating films of Experimental. Examples 1-1 to 7-1 are shown in Table 2. All the thermal spray coating films exhibited a low etching rate and were thus resistant to corrosion, in particular, the thermal spray films in Experimental Examples 1-1 to 5-1 exhibited low etching rates compared with the films of Experimental Examples 6-1 and 7-1. This suggests that the corrosion resistance can be improved by increasing the mass ratio $MgO/Al_2O_3$ of MgO to $Al_2O_3$ to more than 2.33.

For the porosity of the thermal spray coating films, it was 14.5% in Experimental. Example 2-1, 12.7% in Experimental Example 4-1, 8.1% in Experimental Example 6-1, and 7.3% in Experimental Example 7-1.

Table 2 shows weight decrease ($mg/cm^2$) per area measured by TG-DTA. The weight decrease in each of Experimental Examples 1-1 to 7-1 was smaller than 1.5 $mg/cm^2$, which represents the weight decrease of a MgO sintered compact not shown in Table 2. Thus, it was found that the thermal spray coating film of the present invention is less water absorbent than MgO and hence has superior water resistance.

The present application claims priority from Japanese Patent Application No. 2014-133870 filed on Jun. 30, 2014, the entire contents of which are incorporated herein by reference.

It should be appreciated that the above-described Examples are not intended to limit the invention.

What is claimed is:

1. A MgO-based ceramic film containing crystalline phases of MgO and $MgAl_2O_4$, wherein Al, but not AlN, is dissolved in MgO to form a solid-solution, and the ceramic film exhibits a diffraction peak representing the (200) plane of MgO at an angle 2θ of more than 42.92° in CuKα XRD measurement, and wherein the diffraction peak representing the (200) plane of MgO at an angle 2θ of more than 42.92° is the highest peak in the range of 2θ=10 to 70°.

2. The MgO-based ceramic film according to claim 1, wherein in the CuKα XRD measurement, a diffraction peak or shoulder appears on the higher angle side of the diffraction peak representing the (200) plane of MgO.

3. The MgO-based ceramic film according to claim 1, wherein the mass ratio $MgO/Al_2O_3$ of MgO to $Al_2O_3$ converted from Mg and Al in terms of oxides is higher than 2.33.

4. The MgO-based ceramic film according to claim 1, having a porosity of 20% or less.

5. The MgO-based ceramic film according to claim 1, which is a thermal spray coating film.

6. A member for semiconductor manufacturing apparatus covered with the MgO-based ceramic film according to claim 1.

7. A method for forming a MgO-based ceramic film including preparing a thermal spray raw material by granulating MgO and $Al_2O_3$ and heat-treating the granules at 1200° C. or more, and thermally spraying the thermal spray raw material onto a predetermined substrate to form the MgO-based ceramic film according to claim 5.

* * * * *